US006451500B1

(12) United States Patent
Leon

(10) Patent No.: US 6,451,500 B1
(45) Date of Patent: Sep. 17, 2002

(54) IMAGING MEMBER CONTAINING HEAT SWITCHABLE CARBOXYLATE POLYMER AND METHOD OF USE

(75) Inventor: Jeffrey W. Leon, Rochester, NY (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/644,600

(22) Filed: Aug. 23, 2000

Related U.S. Application Data

(63) Continuation-in-part of application No. 09/454,151, filed on Dec. 3, 1999.

(51) Int. Cl.[7] .............................................. G03F 7/038

(52) U.S. Cl. ..................... 430/270.1; 430/303; 430/348; 101/463.1; 101/467

(58) Field of Search .......................... 430/270.1, 281.1, 430/286.1, 302, 303, 944, 945, 348; 10/463.1; 101/467

(56) References Cited

U.S. PATENT DOCUMENTS

| | | | | |
|---|---|---|---|---|
| 4,034,183 A | | 7/1977 | Uhlig | 219/122 |
| 4,081,572 A | | 3/1978 | Pacansky | 427/53 |
| 4,405,705 A | | 9/1983 | Etoh et al. | 430/270 |
| 4,548,893 A | | 10/1985 | Lee et al. | 430/296 |
| 4,634,659 A | | 1/1987 | Esumi et al. | 430/302 |
| 4,693,958 A | | 9/1987 | Schwartz et al. | 430/302 |
| 5,512,418 A | | 4/1996 | Ma | 430/271.1 |
| 5,910,395 A | | 6/1999 | Li et al. | 430/302 |
| 5,922,512 A | | 7/1999 | DoMinh | 430/302 |
| 6,146,812 A | * | 11/2000 | Leon et al. | 430/270.1 |
| 6,153,352 A | * | 11/2000 | Oohashi et al. | 430/270.1 |
| 6,159,657 A | * | 12/2000 | Fleming et al. | 430/270.1 |
| 6,165,679 A | * | 12/2000 | Van Damme et al. | 430/270.1 |
| 6,165,691 A | * | 12/2000 | Damme et al. | 430/303 |
| 6,190,830 B1 | * | 2/2001 | Leon et al. | 430/270.1 |
| 6,190,831 B1 | * | 2/2001 | Leon et al. | 430/270.1 |
| 6,242,155 B1 | * | 6/2001 | Yamasaki et al. | 430/270.1 |
| 6,365,705 B1 | * | 4/2002 | Leon | 528/289 |

FOREIGN PATENT DOCUMENTS

| | | |
|---|---|---|
| EP | 0 652 483 A1 | 5/1995 |
| EP | 0 924 102 A1 | 6/1999 |
| EP | 980754 | 2/2000 |
| EP | 1031412 | 8/2000 |
| WO | WO 92/09934 | 6/1992 |

* cited by examiner

*Primary Examiner*—Rosemary Ashton
*Assistant Examiner*—Barbara Gilmore
(74) *Attorney, Agent, or Firm*—Baker Botts L.L.P.

(57) ABSTRACT

An imaging member, such as a negative-working printing plate or on-press cylinder, can be prepared using a hydrophilic imaging layer comprised of a heat-sensitive hydrophilic polymer that comprises recurring units comprising quaternary ammonium carboxylate groups. These quaternary ammonium carboxylate groups include at least one substituted-alkylene($C_1$–$C_3$)-phenyl group. The imaging member can also include an infrared radiation sensitive material to provide added sensitivity to heat that can be supplied by laser irradiation in the IR region. The heat-sensitive polymer is considered "switchable" in response to heat, and provides a lithographic image without wet processing.

23 Claims, No Drawings

IMAGING MEMBER CONTAINING HEAT SWITCHABLE CARBOXYLATE POLYMER AND METHOD OF USE

RELATED APPLICATION

This is a Continuation-in-part application of U.S. Ser. No. 09/454,151 filed Dec. 3, 1999 by Leon and Fleming.

FIELD OF THE INVENTION

This invention relates in general to lithographic printing plates and specifically to lithographic printing plates that require no wet processing after imaging. The invention also relates to a method of digitally imaging such imaging members, and to a method of printing using them.

BACKGROUND OF THE INVENTION

The art of lithographic printing is based upon the immiscibility of oil and water, wherein an oily material or ink is preferentially retained by an imaged area and the water or fountain solution is preferentially retained by the non-imaged areas. When a suitably prepared negative working printing plate is moistened with water and ink is then applied the background or non-imaged areas retain the water and repel the ink while the imaged areas accept the ink and repel the water. The reverse holds true for positive working plates, in which the background is imaged. The ink is then transferred to the surface of a suitable substrate, such as cloth, paper or metal, thereby reproducing the image.

Very common lithographic printing plates include a metal or polymer support having thereon an imaging layer sensitive to visible or UV light. Both positive and negative-working printing plates can be prepared in this fashion. Upon exposure, and perhaps post-exposure heating, either imaged or non-imaged areas are removed using wet processing chemistries.

Thermally sensitive printing plates are less common, yet represent a steadily growing market. Currently, most of these plates utilize similar materials and similar imaging mechanisms as UV-imageable plates. For example, a thermal acid generator might be used in lieu of a photoacid generator and the same series of preheat and development steps might be employed. The main advantage of these digital plates is that the thermal imaging process is rapid and inexpensive compared to the analog process involving the creation of a mask and blanket UV exposure. Examples of such plates are described in U.S. Pat. No. 5,372,915 (Haley et al). They include an imaging layer comprising a mixture of dissolvable polymers and an infrared radiation absorbing compound. While these plates can be imaged using lasers and digital information, they require wet processing using alkaline developer solutions.

It has been recognized that a lithographic printing plate could be created by ablating an IR absorbing layer. For example, Canadian 1,050,805 (Eames) discloses a dry planographic printing plate comprising an ink receptive substrate, an overlying silicone rubber layer, and an interposed layer comprised of laser energy absorbing particles (such as carbon particles) in a self-oxidizing binder (such as nitrocellulose). Such plates were exposed to focused near IR radiation with a $Nd^{++}YAG$ laser. The absorbing layer converted the infrared energy to heat thus partially loosening, vaporizing or ablating the absorber layer and the overlying silicone rubber. The plate was developed by applying naphtha solvent to remove debris from the exposed image areas. Similar plates are described in *Research Disclosure* 19201, 1980 as having vacuum-evaporated metal layers to absorb laser radiation in order to facilitate the removal of a silicone rubber overcoated layer. These plates were developed by wetting with hexane and rubbing. $CO_2$ lasers are described for ablation of silicone layers by Nechiporenko & Markova, PrePrint 15th International IARIGAI Conference, June 1979, Lillehammer, Norway, Pira Abstract 02-79-02834. Typically, such printing plates require at least two layers on a support, one or more being formed of ablatable materials. Other publications describing ablatable printing plates include U.S. Pat. No. 5,385,092 (Lewis et al), U.S. Pat. No. 5,339,737 (Lewis et al), U.S. Pat. No. 5,353,705 (Lewis et al), U.S. Pat. No. Reissue 35,512 (Nowak et al) and U.S. Pat. No. 5,378,580 (Leenders).

While the noted printing plates used for digital, processless printing have a number of advantages over the more conventional photosensitive printing plates, there are a number of disadvantages with their use. The process of ablation creates debris and vaporized materials that must be collected. The laser power required for ablation can be considerably high, and the components of such printing plates may be expensive, difficult to coat, or unacceptable in resulting printing quality. Such plates generally require at least two coated layers on a support.

One approach toward non-process, non-ablation printing plates involves the use of "switchable polymers." These polymers will undergo thermally driven chemical reactions in which highly polar moieties are either created or destroyed under imaging conditions. This results in the storage of the imaging data as hydrophilic and hydrophobic regions of a continuous polymer surface. In addition to not needing wet processing, such plates have the advantage of not needing any type of material collection devices which ablation-based plates require. Also unlike ablation plates, a switchable polymer plate in its ideal form would consist of one layer and can be manufactured on a single pass through a coating machine.

U.S. Pat. No. 4,034,183 (Uhlig) describes the use of high powered lasers to convert hydrophilic surface layers to hydrophobic surfaces. A similar process is described for converting polyamic acids into polyimides in U.S. Pat. No. 4,081,572 (Pacansky). The use of high-powered lasers is undesirable in the industry because of their power requirements and because of their need for cooling and frequent maintenance.

U.S. Pat. No. 4,634,659 (Esumi et al) describes imagewise irradiating hydrophobic polymer coatings to render exposed regions more hydrophilic in nature. While this concept was one of the early applications of converting surface characteristics in printing plates, it has the disadvantages of requiring long UV light exposure times (up to 60 minutes), and the plate's use is in a positive-working mode only.

U.S. Pat. No. 4,405,705 (Etoh et al) and U.S. Pat. No. 4,548,893 (Lee et al) describe amine-containing polymers for photosensitive materials used in non-thermal processes. The imaged materials also require wet processing after imaging.

Thermal processes using polyamic acids and vinyl polymers with pendant quaternary ammonium groups are described in U.S. Pat. No. 4,693,958 (Schwartz et al), but wet processing is required after imaging. In addition, the polyamic acid switchable polymers in this invention show low discrimination magnitude and the quaternary ammonium-based examples suffer from wash-off problems of both the foreground and the background.

U.S. Pat. No. 5,512,418 (Ma) describes the use of polymers having cationic quaternary ammonium groups that are heat-sensitive. However, like most of the materials described in the art, wet processing is required after imaging.

WO 92/09934 (Vogel et al) describes photosensitive compositions containing a photoacid generator and a polymer with acid labile tetrahydropyranyl or activated ester groups. However, imaging of these compositions converts the imaged areas from hydrophobic to hydrophilic in nature and the imaged areas are prone to scumming.

In addition, EP-A 0 652 483 (Ellis et al) describes lithographic printing plates imageable using IR lasers, and which do not require wet processing. These plates comprise an imaging layer that becomes more hydrophilic upon imagewise exposure to heat. This coating contains a polymer having pendant groups (such as t-alkyl carboxylates) that are capable of reacting under heat or acid to form more polar, hydrophilic groups. Imaging such compositions converts the imaged areas from hydrophobic to relatively more hydrophilic in nature, and thus requires imaging the background of the plate, which is generally a larger area. This can be a problem when imaging to the edge of the printing plate is desired. As with the plates described in WO 92/09934, the plates described in Ellis et al are also prone to scumming.

Although a number of switchable polymer-based printing plates are known, there remain technical barriers toward the utilization of this technology in commercially feasible products. Three difficulties commonly experienced in the design of switchable polymer-based plates are physical wear of the plates, and the related problems of background scumming and blanket toning.

"Physical wear" refers to the mechanical degradation of a printing plate during the printing process. Sufficient resistance to physical wear is often the major factor in determining whether or not a printing plate will be useful for press runs of very long length.

The problems of scumming (also known as "toning") and blanket toning typically result if ink-rejecting areas of the plate are not sufficiently polar. The uptake of ink in undesired areas of the plate results in the consequent undesirable transfer of ink to the final prints. This manifests itself as an unwanted gray or black color in background areas of the final prints. Scumming may occur in both negative-working plates (in nonimaged areas) and positive plates (in imaged areas). The related problem of blanket toning refers to the buildup of ink in the background areas of the printing press blanket cylinder. Excessive blanket toning results in the necessity of periodically stopping a press run to manually clean the ink from the blanket. This can have a negative impact on the productivity of a printing process.

In conventional developable printing plates, grained, anodized aluminum has proven to be a reliable background substrate. It is mechanically tough and shows little evidence of wear even on very long press runs. The material can also tolerate a wide range of press conditions without showing scumming or excessive blanket toning. Generally, the imaging process imparts a change in solubility to the imaged areas of the plate such that, after wet development, a grained, anodized aluminum surface is selectively exposed. Switchable polymer-based plates, however, are designed such that no portions of the imageable layer of the plate are removed. Thus the favorable background properties of an aluminum support substrate cannot be utilized. Not surprisingly, scumming behavior has been observed in many of the switchable polymer-based plates that have been reported in the patent literature.

In EP-A 0 924 102, it is reported that scumming may occur with some known printing plates containing switchable polymers in the imaging layers.

In switchable polymer-based printing plates, a major challenge lies in the creation of a synthetic polymer surface that has both adequate physical toughness and resistance to toning. In general, surfaces that reject ink well tend to be very highly hydrophilic and thus when exposed to an aqueous fountain solution they may be dissolved and lose adhesion to the support substrate. Alternatively, they may swell and become prone to abrasion and wear. It can be expected, then, that many of the synthetic polymer surfaces that are most resistant to toning will also have inherently inadequate physical properties for use in long-run printing plates. It is not uncommon that approaches to improve a switchable polymer plate's scumming behavior by increasing the hydrophilicity of the imageable layer will result in a consequent decrease in the wear resistance of the plate. Similarly, efforts to improve the physical toughness of a plate can result in an increase in scumming propensity.

Copending U.S. Ser. No. 09/454,151 noted above describes and claims negative-working imaging members that overcome the problems noted above and provide clean backgrounds, minimal blanket toning and improved resistance to wear. While the heat-switchable polymers described therein provide a significant advance in the art, even further improvements are desired in imaging speed and shorter roll-up values.

SUMMARY OF THE INVENTION

Improvements in heat-switchable imaging members are provided by using a specific class of heat-sensitive, switchable polymers that provide a good balance of physical toughness with resistance to scumming and blanket toning when incorporated into an imaging member. They also exhibit increased imaging speeds.

The switchable polymers can be obtained by simply reacting any of the carboxylic acid-containing polymers (or polymers containing equivalent groups, such as anhydrides) with a quaternary ammonium hydroxide that contains a substituted-alkylene($C_1$–$C_3$)-phenyl group. The heat-sensitive polymer, when formulated with a photothermal conversion material and preferably a crosslinking agent, provides a mechanically durable infrared radiation sensitive imaging member that exhibits excellent resistance to scumming and blanket toning.

One embodiment of the present invention is an imaging member comprising a support having thereon a hydrophilic imaging layer comprising a hydrophilic heat-sensitive polymer comprising recurring units that comprise quaternary ammonium carboxylate groups containing at least one substituted-alkylene($C_1$–$C_3$)-phenyl group.

This invention also provides a method of imaging comprising the steps of:

A) providing the imaging member described above, and

B) imagewise exposing the imaging member to energy to provide exposed and unexposed areas in the imaging layer and the imaging member, whereby the exposed areas are rendered more oleophilic than the unexposed areas by heat provided by the imagewise exposing.

In addition, the method of imaging can be extended to be a method of printing by following steps A and B with a further step of C) in the presence of water or a fountain solution, contacting the imagewise exposed imaging member with a lithographic printing ink, and imagewise transferring the ink to a receiving material.

The ammonium cations used in the heat-sensitive polymers include one or more substituted-alkylene($C_1$–$C_3$)-phenyl groups (preferably benzyl groups), and the result is improved imaging speed and roll-up over many of the heat-sensitive polymers described in U.S. Ser. No. 09/454,151 (noted above) that do not have such groups. The one or more noted alkylenephenyl groups comprise one or more substituents on either or both of the alkylene and phenyl moieties. As described in more detail below, the substitution can be of any of a wide variety of patterns and chemical components.

The imaging member (for example, printing plates) of this invention have improved mechanical durability over other "switchable polymer" processless printing plates described in the literature.

DETAILED DESCRIPTION OF THE INVENTION

The imaging members of this invention comprise a support and one or more layers thereon that are heat-sensitive. The support can be any self-supporting material including polymeric films, glass, ceramics, metals or stiff papers, or a lamination of any of these materials. The thickness of the support can be varied. In most applications, the thickness should be sufficient to sustain the wear from printing and thin enough to wrap around a printing form. A preferred embodiment uses a polyester support prepared from, for example, polyethylene terephthalate or polyethylene naphthalate, and having a thickness of from about 100 to about 310 $\mu$m. Another preferred embodiment uses aluminum foil having a thickness of from about 100 to about 600 $\mu$m. The support should resist dimensional change under conditions of use.

The support can also be a cylindrical surface having the heat-sensitive polymer composition thereon, and thus being an integral part of the printing press. The use of such imaged cylinders is described for example in U.S. Pat. No. 5,713,287 (Gelbart).

The support may be coated with one or more "subbing" layers to improve adhesion of the final assemblage. Examples of subbing layer materials include, but are not limited to, gelatin and other naturally occurring and synthetic hydrophilic colloids and vinyl polymers (such as vinylidene chloride copolymers) known for such purposes in the photographic industry, vinylphosphonic acid polymers, silicon-based sol-gel materials, such as those prepared from alkoxysilanes such as aminopropyltriethoxysilane or glycidoxypropyltriethoxysilane, titanium sol gel materials, epoxy functional polymers, and ceramics.

The backside of the support may be coated with antistatic agents and/or slipping layers or matte layers to improve handling and "feel" of the imaging member.

The imaging members, however, have preferably only one heat-sensitive layer that is required for imaging. This hydrophilic layer includes one or more heat-sensitive polymers, and optionally but preferably a photothermal conversion material (described below), and preferably provides the outer printing surface of the imaging member. Because of the particular polymer(s) used in the imaging layer, the exposed (imaged) areas of the layer are rendered more oleophilic in nature.

The heat-sensitive polymers useful in this invention comprise random recurring units at least some of which comprise particular quaternary ammonium salts of carboxylic acids. The polymers generally have a molecular weight of at least 3,000 Daltons and preferably of at least 20,000 Daltons.

The polymer randomly comprises one or more types of carboxylate-containing recurring units (or equivalent anhydride units) units identified as "A" below in Structure 1 and optionally one or more other recurring units (non-carboxylated) denoted as "B" in Structure 1.

The carboxylate-containing recurring units are linked directly to the polymer backbone which is derived from the "A" monomers, or are connected by spacer units identified as "X" in Structure 1 below. This spacer unit can be any divalent aliphatic, alicyclic or aromatic group that does not adversely affect the polymer's heat-sensitivity. For example, "X" can be a substituted or unsubstituted alkylene group having 1 to 16 carbon atoms (such as methylene, ethylene, isopropylene, n-propylene and n-butylene), a substituted or unsubstituted arylene group having 6 to 10 carbon atoms in the arylene ring (such as m- or p-phenylene and naphthylenes), substituted or unsubstituted combinations of alkylene and arylene groups (such arylenealkylene, arylenealkylenearylene and alkylenearylenealkylene groups), and substituted or unsubstituted N-containing heterocyclic groups. Any of these defined groups can be connected in a chain with one or more amino, carbonamido, oxy, thio, amido, oxycarbonyl, aminocarbonyl, alkoxycarbonyl, alkanoyloxy, alkanoylamino or alkaminocarbonyl groups. Particularly useful "X" spacers contains an ester or amide connected to an alkylene group or arylene group (as defined above), such as when the ester and amide groups are directed bonded to "A".

Structure 1

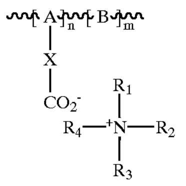

Additional monomers (non-carboxylate monomers) that provide the recurring units represented by "B" in Structure 1 above include any useful hydrophilic or oleophilic ethylenically unsaturated polymerizable comonomers that may provide desired physical or printing properties of the surface imaging layer or which provide crosslinkable functionalities. One or more "B" monomers may be used to provide these recurring units, including but not limited to, acrylates, methacrylates, styrene and its derivatives, acrylamides, methacrylamides, olefins, vinyl halides, vinyl ethers, and any monomers (or precursor monomers) that contain carboxy groups (that are not quaternized).

The quaternary ammonium carboxylate-containing polymer may be chosen or derived from a variety of polymers and copolymer classes including, but not necessarily limited to polyamic acids, polyesters, polyamides, polyurethanes, silicones, proteins (such as modified gelatins), polypeptides, and polymers and copolymers based on ethylenically unsaturated polymerizable monomers such as acrylates, methacrylates, acrylamides, methacrylamides, vinyl ethers, vinyl esters, alkyl vinyl ethers, maleic acid/anhydride, itaconic acid/anhydride, styrenics, acrylonitrile, and olefins such as butadiene, isoprene, propylene, and ethylene. A parent carboxylic acid-containing polymer (that is, one that is reacted to form quaternary ammonium carboxylate groups) may contain more than one type of carboxylic acid-containing monomer. Certain monomers, such as maleic acid/anhydride and itaconic acid/anhydride may contain more than one carboxylic acid unit. Preferably, the parent carboxylic acid-containing polymer is an addition polymer or copolymer containing acrylic acid, methacrylic acid, maleic acid or anhydride, or itaconic acid or anhydride or a conjugate base or hydrolysis product thereof.

In Structure 1, n represents about 25 to 100 mol % (preferably from about 50 to 100 mol %), and m represents 0 to about 75 mol % (preferably from 0 to about 50 mol %).

While Structure 1 could be interpreted to show polymers derived from only two ethylenically unsaturated polymerizable monomers, it is intended to include terpolymers and other polymers derived from more than two monomers.

The quaternary ammonium carboxylate groups must be present in the heat-sensitive polymer useful in this invention in such a quantity as to provide a minimum of one mole of the quaternary ammonium carboxylate groups per 1000 g of polymer and a maximum of one mole of quaternary ammonium carboxylate groups per 45 g of polymer. Preferably, this ratio (moles of quaternary ammonium carboxylate groups to grams of polymer) is from about 1:500 to about 1:45 and more preferably, this ratio is from about 1:300 to about 1:45. This parameter is readily determined from a knowledge of the molecular formula of a given polymer (and the monomeric starting materials) or standard titrimetric or spectrometric methods.

The quaternary ammonium counterion of the carboxylate functionalities may be any ammonium ion in which the nitrogen is covalently bound to a total of four alkyl or aryl substituents as defined below, provided at least one of the four substituents is a substituted-alkylene($C_1$–$C_3$)phenyl group.

More particularly, in Structure 1 noted above, $R_1$, $R_2$ and $R_3$ are independently substituted or unsubstituted alkyl groups having 1 to 12 carbon atoms [such as methyl, ethyl, n-propyl, isopropyl, 1-butyl, hexyl, methoxy, trichloromethyl, hydroxyethyl, 2-propanonyl, ethoxycarbonymethyl, benzyl, substituted benzyl (such as 4-methoxybenzyl, o-bromobenzyl, and p-trifluoromethylbenzyl), and cyanoalkyl], or substituted or unsubstituted aryl groups having 6 to 14 carbon atoms in the carbocyclic ring (such as phenyl, naphthyl, xylyl, p-methoxyphenyl, p-methylphenyl, m-methoxyphenyl, p-chlorophenyl, p-methylthiophenyl, p-N,N-dimethylaminophenyl, methoxycarbonylphenyl and cyanophenyl). Alternatively, any two or all three of $R_1$, $R_2$ and $R_3$ can be combined to form a ring (or two rings for four substituents) with the quaternary nitrogen atom, the ring having 5 to 14 carbon, oxygen, sulfur and nitrogen atoms in the ring. Such rings include, but are not limited to, morpholine, piperidine, pyrrolidine, carbazole, indoline and isoindoline rings. The nitrogen atom can also be located at the tertiary position of the fused ring. Other useful substituents for these various groups would be readily apparent to one skilled in the art, and any combinations of the expressly described substituents are also contemplated.

Alternatively, multi-cationic ionic species containing more than one quaternary ammonium unit covalently bonded together and having charges greater than +1 (for example +2 for diammonium ions, and +3 for triammonium ions) may be used in this invention.

Preferably, $R_1$, $R_2$ and $R_3$ are independently linear or branched unsubstituted alkyl groups of 1 to 3 carbon atoms, or linear or branched hydroxyalkyl groups of 1 to 3 carbon atoms that comprise 1 to 3 hydroxy groups as the only substituents (generally only one hydroxy group per carbon atom). More preferably, these radicals are independently methyl, hydroxymethyl, ethyl, 2-hydroxyethyl, 1-hydroxyethyl or 1,2-dihydroxyethyl and most preferably, they are either methyl or 2-hydroxyethyl.

$R_4$ is a substituted alkylenephenyl group that has at least one substituent on either the alkylene or phenyl moiety of the group. More preferably, the one or more substituents are on the phenyl moiety. The alkylene moiety can be linear or branched in nature and has from 1 to 3 carbon atoms (such as methylene, ethylene, n-propylene or isopropylene). Preferably, the alkylene moiety of $R_4$ has 1 or 2 carbon atoms and more preferably, it is methylene. The alkylene moiety can have as many substituents as there are available hydrogen atoms to be removed from a carbon atom. Useful alkylene substituents are the same as those described below in defining the phenyl substituents, but the most preferred substituents for the alkylene moiety are fluoro and alkoxy.

The phenyl moiety of $R_4$ can have from 1 to 5 substituents in any useful substitution pattern. Useful substituents include but are not limited to, halo groups (such as fluoro, chloro, bromo, and iodo), substituted or unsubstituted alkyl groups having from 1 to 12 carbon atoms (such as methyl, ethyl, isopropyl, t-butyl, n-pentyl and n-propyl) that can be further substituted with any of the substituents listed herein (such as haloalkyl groups including trihalomethyl groups), substituted or unsubstituted alkoxy groups having 1 to 12 carbon atoms (such as methoxy, ethoxy, isopropoxy, n-pentoxy and n-propoxy), cyano, nitro, substituted or unsubstituted aryl groups having 6 to 14 carbon atoms in the aromatic carbocyclic ring (as defined above for $R_1$, $R_2$ and $R_3$), substituted or unsubstituted alkyleneoxycarbonyl groups having 2 to 12 carbon atoms (such as methyleneoxycarbonyl, ethyleneoxycarbonyl and i-propyleneoxycarbonyl), substituted or unsubstituted alkylcarbonyloxy groups having 2 to 12 carbon atoms (such as methylenecarbonyloxy, ethylenecarbonyloxy and isopropylenecarbonyloxy), substituted or unsubstituted alkylcarbonyl groups having 2 to 12 carbon atoms (such as methylenecarbonyl, ethylenecarbonyl and isopropylenecarbonyl), amido groups, aminocarbonyl groups, trihalomethyl groups, perfluoroalkyl groups, formyl, mercapto and substituted or unsubstituted heterocyclic groups having 5 to 14 atoms in the ring that includes one or more nitrogen, sulfur, oxygen or selenium atoms with the remainder being carbon atoms (such as pyridyl, oxazolyl, thiphenyl, imidazolyl, and piperidinyl).

Preferably, $R_4$ contains 1 to 5 substituents (more preferably 1 or 2 substituents) on the phenyl moiety, which substituents are either halo groups, substituted or unsubstituted methyl or ethyl groups, or substituted or unsubstituted methoxy or 2-ethoxy groups. More preferably, $R_4$ comprises 1 to 3 methyl, fluoro, chloro, bromo or methoxy groups, or any combination of these groups on either the alkylene or phenyl moiety.

The use of the particular ammonium ions in which all of $R_1$–$R_3$ are 2-hydroxyethyl groups may result in less odor during imaging the heat-sensitive polymer.

Particularly useful heat-sensitive polymers of these invention are described below as Polymers 2–14 and 16.

The heat-sensitive polymers may be readily prepared using many methods that will be obvious to one skilled in the art. Many carboxylic acid or anhydride-containing polymers are commercially available. Substituted benzyltrialkylammonium salts can be readily synthesized using preparative techniques that would be obvious to one skilled in the art. One convenient method involves the reaction of a substituted benzylamine with a desired alkyl halide, alkyl sulfonate ester or other alkyl-containing compound having a suitable "leaving" group. Another useful method involves the reaction of a substituted benzylic halide with a trialkylamine.

The carboxylic acid or anhydride-containing polymers can be converted to the desired quaternary ammonium carboxylate salts by a variety of methods including, but not necessarily limited to:

1) the reaction of a carboxylic acid or acid anhydride-containing polymer with the hydroxide salt of the desired quaternary ammonium ion,
2) the use of ion exchange resin containing the desired quaternary ammonium ion,
3) the addition of the desired ammonium ion to a solution of the carboxylic acid-containing polymer or a salt thereof followed by dialysis,
4) the addition of a volatile acid salt of the desired quaternary ammonium ion (such as an acetate or formate salt) to the carboxylic acid-containing polymer followed by evaporation of the volatile component upon drying, 5) electrochemical ion exchange techniques, and 6) the polymerization of monomers containing the desired quaternary ammonium carboxylate units.

Preferably, the first method is employed.

Although it is especially preferred that all of the carboxylic acid (or latent carboxylic acid) functionalities of the polymer are converted to the desired quaternary ammonium salt, imaging compositions in which the polymer is incompletely converted may still retain satisfactory imageability. Preferably, at least 50 monomer percent of the carboxylic acid (or equivalent anhydride) containing monomers are reacted to form the desired quaternary ammonium groups.

In the preferred embodiments of this invention, the heat-sensitive polymer is crosslinked. Crosslinking can be provided in a number of ways. There are numerous monomers and methods for crosslinking that are familiar to one skilled in the art. Some representative crosslinking strategies include, but are not necessarily limited to:

1) the reaction of Lewis basic units (such as carboxylic acid, carboxylate, amine and thiol units within the polymer with a multifunctional epoxide-containing crosslinker or resin, 2) the reaction of epoxide units within the polymer with multifunctional amines, carboxylic acids, or other multifunctional Lewis basic unit, 3) the irradiative or radical-initiated crosslinking of double bond-containing units such as acrylates, methacrylates, cinnamates, or vinyl groups, 4) the reaction of multivalent metal salts with ligating groups within the polymer (the reaction of zinc salts with carboxylic acid-containing polymers is an example), 5) the use of crosslinkable monomers that react via the Knoevenagel condensation reaction, such as (2-acetoacetoxy)ethyl acrylate and methacrylate, 6) the reaction of amine, thiol, or carboxylic acid groups with a divinyl compound (such as bis(vinylsulfonyl) methane) via a Michael addition reaction, 7) the reaction of carboxylic acid units with crosslinkers containing multiple aziridine or oxazoline units, 8) the reaction of acrylic acid units with a melamine resin, 9) the reaction of isocyanate crosslinkers with amines, thiols, or alcohols within the polymer, 10) mechanisms involving the formation of interchain sol-gel linkages [such as the use of the 3-(trimethylsilyl)propylmethacrylate monomer], 11) oxidative crosslinking using an added radical initiator (such as a peroxide or hydroperoxide), 12) autooxidative crosslinking, such as employed by alkyd resins, 13) sulfur vulcanization, and 14) processes involving ionizing radiation.

Ethylenically unsaturated polymerizable monomers having crosslinkable groups (or groups that can serve as attachment points for crosslinking additives) can be copolymerized with the other monomers as noted above. Such monomers include, but are not limited to, 3-(trimethylsilyl) propyl acrylate or methacrylate, cinnamoyl acrylate or methacrylate, N-methoxymethyl methacrylamide, N-aminopropylmethacrylamide hydrochloride, acrylic or methacrylic acid and hydroxyethyl methacrylate.

Preferably, crosslinking is provided by the addition of an epoxy-containing resin to the quaternary ammonium carboxylate polymer or by the reaction of a bisvinylsulfonyl compound with amine containing units (such as N-aminopropylmethacrylamide) within the polymer. Most preferably, CR-5L (an epoxide resin sold by Esprit Chemicals) is used for this purpose.

The imaging layer of the imaging member can include one or more of such homopolymers or copolymers, with or without up to 50 weight % (based on total dry weight of the layer) of additional binder or polymeric materials that will not adversely affect its imaging properties.

The amount of heat-sensitive polymer(s) used in the imaging layer is generally at least 0.1 $g/m^2$, and preferably from about 0.1 to about 10 $g/m^2$ (dry weight). This generally provides an average dry thickness of from about 0.1 to about 10 $\mu$m.

The imaging layer can also include one or more conventional surfactants for coatability or other properties, dyes or colorants to allow visualization of the written image, or any other addenda commonly used in the lithographic art, as long as the concentrations are low enough so they are inert with respect to imaging or printing properties.

Preferably, the heat-sensitive imaging layer also includes one or more photothermal conversion materials to absorb appropriate radiation from an appropriate energy source (such as an IR laser), which radiation is converted into heat. Preferably, the radiation absorbed is in the infrared and near-infrared regions of the electromagnetic spectrum. Such materials can be dyes, pigments, evaporated pigments, semiconductor materials, alloys, metals, metal oxides, metal sulfides or combinations thereof, or a dichroic stack of materials that absorb radiation by virtue of their refractive index and thickness. Borides, carbides, nitrides, carbonitrides, bronze-structured oxides and oxides structurally related to the bronze family but lacking the $WO_{2.9}$ component, are also useful.

One particularly useful pigment is carbon of some form (for example, carbon black). Carbon blacks which are surface-functionalized with solubilizing groups are well known in the art and these types of materials are preferred photothermal conversion materials for this invention. Carbon blacks which are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are especially preferred.

Useful absorbing dyes for near infrared diode laser beams are described, for example, in U.S. Pat. No. 4,973,572 (DeBoer), incorporated herein by reference. Particular dyes of interest are "broad band" dyes, that is those that absorb over a wide band of the spectrum. Mixtures of pigments, dyes, or both, can also be used. Particularly useful infrared radiation absorbing dyes include those illustrated as follows:

IR Dye 1

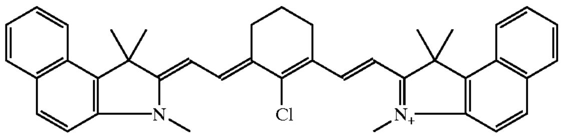

p-Toluenesulfate-

IR Dye 2 Same as Dye 1 but with chloride as the anion.
IR Dye 3
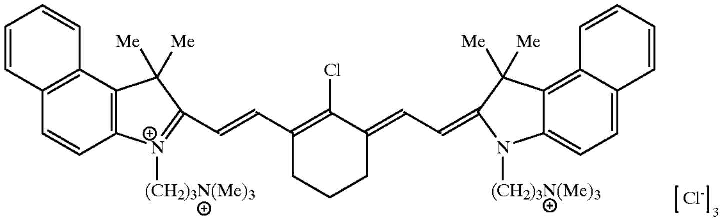
IR Dye 4
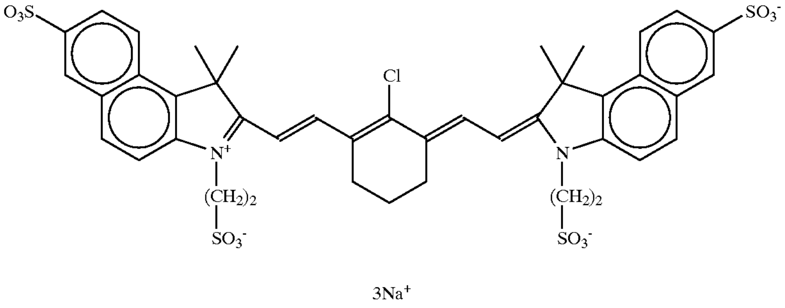
IR Dye 5
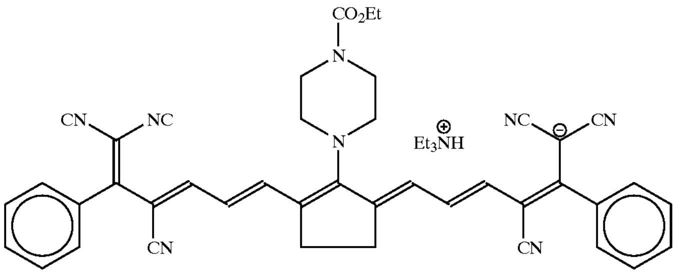
IR Dye 6
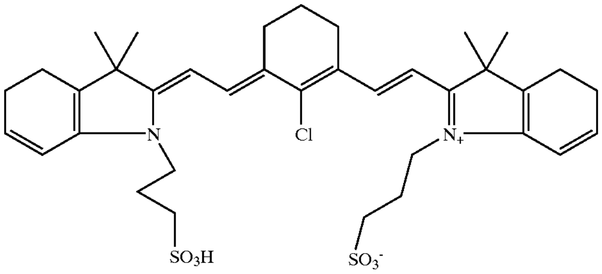
IR Dye 7
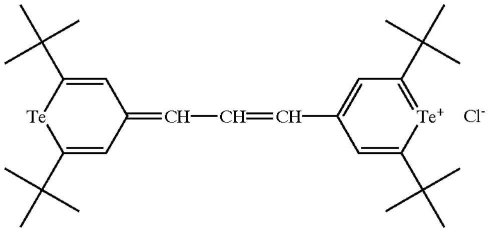

-continued

IR Dye 8

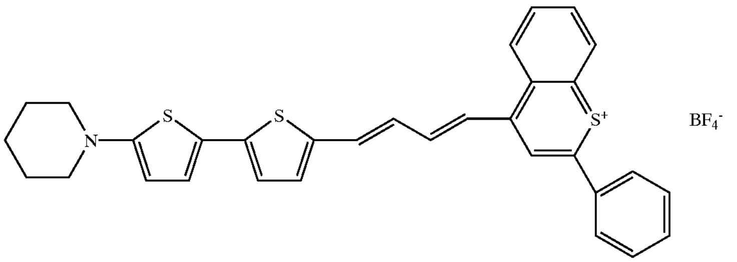

IR Dye 9

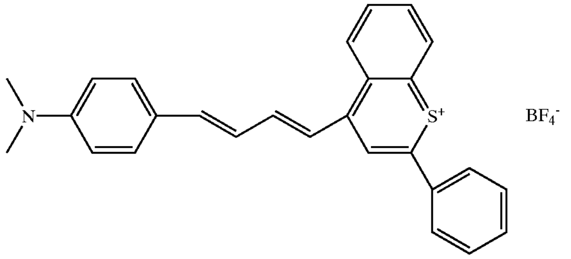

Useful oxonol compounds that are infrared radiation sensitive include Dye 5 noted above and others described in copending and commonly assigned U.S. Ser. No. 09/444,695, filed Nov. 22, 1999 by DoMinh et al.

The photothermal conversion material(s) are generally present in an amount sufficient to provide an optical density of at least 0.3 (preferably of at least 0.5 and more preferably of at least 1.0) at the operating wavelength of the imaging laser. The particular amount needed for this purpose would be readily apparent to one skilled in the art, depending upon the specific material used.

Alternatively, a photothermal conversion material can be included in a separate layer that is in thermal contact with the heat-sensitive imaging layer. Thus, during imaging, the action of the photothermal conversion material can be transferred to the heat-sensitive polymer layer without the material originally being in the same layer.

The heat-sensitive composition can be applied to the support using any suitable equipment and procedure, such as spin coating, knife coating, gravure coating, dip coating or extrusion hopper coating. The composition can also be applied by spraying onto a suitable support (such as an on-press printing cylinder) as described in U.S. Pat. No. 5,713,287 (noted above).

The imaging members of this invention can be of any useful form including, but not limited to, printing plates, printing cylinders, printing sleeves and printing tapes (including flexible printing webs). Preferably, the imaging members are printing plates.

Printing plates can be of any useful size and shape (for example, square or rectangular) having the requisite heat-sensitive imaging layer disposed on a suitable support. Printing cylinders and sleeves are known as rotary printing members having the support and heat-sensitive layer in a cylindrical form. Hollow or solid metal cores can be used as substrates for printing sleeves.

During use, the imaging member of this invention is exposed to a suitable source of energy that generates or provides heat, such as a focused laser beam or a thermoresistive head, in the foreground areas where ink is desired in the printed image, typically from digital information supplied to the imaging device. No additional heating, wet processing, or mechanical or solvent cleaning is needed before the printing operation. A laser used to expose the imaging member of this invention is preferably a diode laser, because of the reliability and low maintenance of diode laser systems, but other lasers such as gas or solid state lasers may also be used. The combination of power, intensity and exposure time for laser imaging would be readily apparent to one skilled in the art. Specifications for lasers that emit in the near-IR region, and suitable imaging configurations and devices are described in U.S. Pat. No. 5,339,737 (Lewis et al), incorporated herein by reference. The imaging member is typically sensitized so as to maximize responsiveness at the emitting wavelength of the laser. For dye sensitization, the dye is typically chosen such that its $\lambda_{max}$ closely approximates the wavelength of laser operation.

The imaging apparatus can operate on its own, functioning solely as a platesetter, or it can be incorporated directly into a lithographic printing press. In the latter case, printing may commence immediately after imaging, thereby reducing press set-up time considerably. The imaging apparatus can be configured as a flatbed recorder or as a drum recorder, with the imaging member mounted to the interior or exterior cylindrical surface of the drum.

In the drum configuration, the requisite relative motion between the imaging device (such as a laser beam) and the imaging member can be achieved by rotating the drum (and the imaging member mounted thereon) about its axis, and moving the imaging device parallel to the rotation axis, thereby scanning the imaging member circumferentially so the image "grows" in the axial direction. Alternatively, the thermal energy source can be moved parallel to the drum axis and, after each pass across the imaging member, increment angularly so that the image "grows" circumferentially. In both cases, after a complete scan by the laser beam, an image corresponding to the original document or picture can be applied to the surface of the imaging member.

In the flatbed configuration, the laser beam is drawn across either axis of the imaging member, and is indexed along the other axis after each pass. Obviously, the requisite relative motion can be produced by moving the imaging member rather than the laser beam.

While laser imaging is preferred in the practice of this invention, imaging can be provided by any other means that provides thermal energy in an imagewise fashion. For example, imaging can be accomplished using a thermoresistive head (thermal printing head) in what is known as "thermal printing", described example in U.S. Pat. No. 5,488,025 (Martin et al). Thermal print heads are commercially available (for example, as Fujitsu Thermal Head FTP-040 MCS0001 and TDK Thermal Head F415 HH7-1089).

Without the need for any wet processing after imaging, printing can then ben carried out by applying a lithographic ink and fountain solution to the imaging member printing surface, and then transferring the ink to a suitable receiving material (such as cloth, paper, metal, glass or plastic) to provide a desired impression of the image thereon. If desired, an intermediate "blanket" roller can be used to transfer the ink from the imaging member to the receiving material. The imaging members can be cleaned between impressions, if desired, using conventional cleaning means.

The following examples illustrate the practice of the invention, and are not meant to limit it in any way.

Preparation of Useful Switchable Heat-sensitive Polymers

The polymers prepared as described below were characterized as having the ratio of moles of quaternary ammonium carboxylate groups to grams of polymer as shown in TABLE I below.

| Polymer | Ratio of moles of quaternary ammonium carboxylate groups to grams of polymer |
|---|---|
| 1 | 1:221 |
| 2 | 1:235 |
| 3 | 1:249 |
| 4 | 1:251 |
| 5 | 1:256 |
| 6 | 1:300 |
| 7 | 1:239 |
| 8 | 1:251 |
| 9 | 1:235 |
| 10 | 1:291 |
| 11 | 1:263 |
| 12 | 1:290 |
| 13 | 1:290 |
| 14 | 1:311 |
| 15 | 1:311 |
| 16 | 1:325 |

TABLE I

1

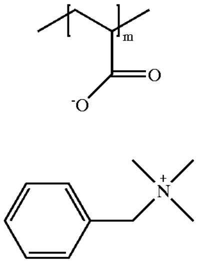

control

TABLE I-continued

2

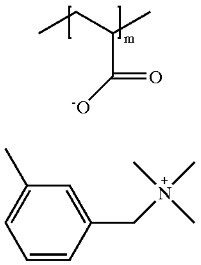

3

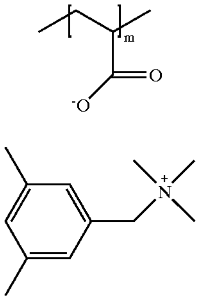

4

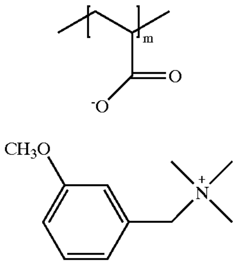

5

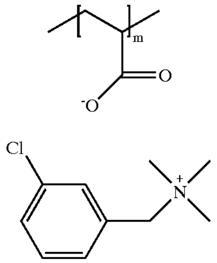

6

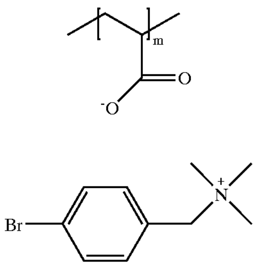

TABLE I-continued
7
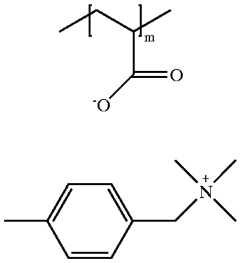
8
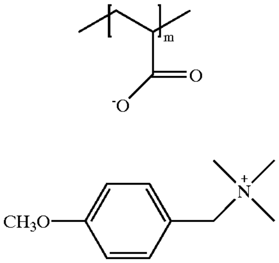
9
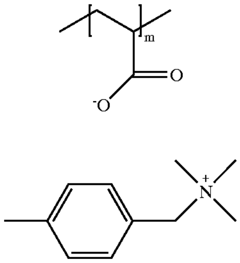
10
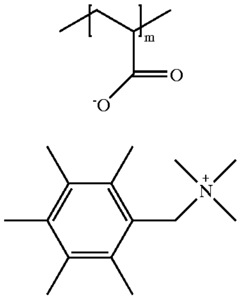
11
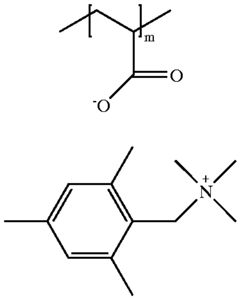
TABLE I-continued
12
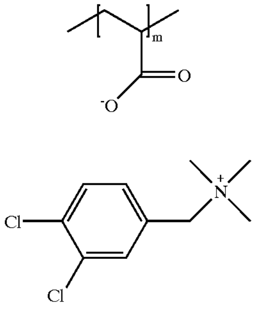
13
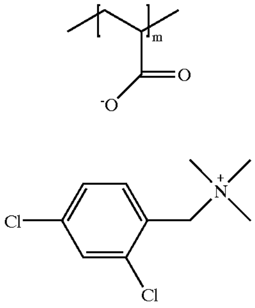
14
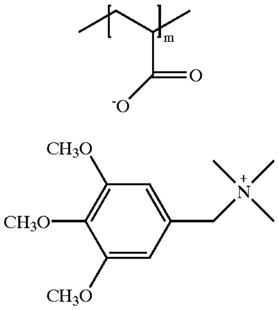
15
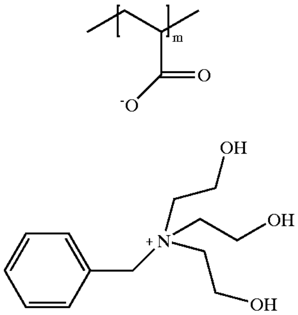
control TABLE I-continued

| | |
|---|---|
| 16 | 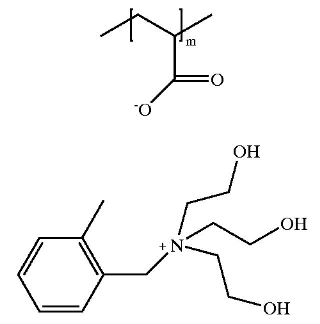 |

Preparation of Polymer 1 solution

An aqueous solution (60.00 g, 25% w/w) of polyacrylic acid (Polysciences, MW~90,000) was combined with distilled water (60 g) and 84.63 g of a 41.5% (w/w) methanolic solution of benzyltrimethylammonium hydroxide (Aldrich). A gummy precipitate initially formed and slowly redissolved over a half-hour. The resulting Polymer 1 was stored as a 32% (w/w) solution in water-methanol. Because this polymer is outside the scope of the present invention (no substituents on benzyl group), this polymer was used to make a Control printing plate.

Preparation of Solutions of Polymers 2–14

Polymers 2–14 were all synthesized using a basic three-step process. They are all within the scope of the present invention. The first step involved the reaction of the substituted benzyl halides with 1.5 to 3.0 equivalents of trimethylamine in ether to yield substituted benzyltrimethylammonium halide salts. These salts were characterized by proton NMR and electrospray-MS and the purity was further checked by reverse phase HPLC.

The second step involved the conversion of the halide salts to the corresponding hydroxides using 1.0 equivalents of $Ag_2O$ in methanol-water followed by the removal of volatiles to afford solutions with a hydroxide content of 0.5 to 2.5 mEq/g as determined by HCl titration. The hydroxide salts were characterized by electrospray-MS and the purity was checked by reverse phase HPLC.

The third step was the neutralization of polyacrylic acid (MW=90,000) with the various substituted benzyltrimethylammonium hydroxides to yield solutions (usually 20% w/w) of the polymers in MeOH/water (having weight ratios ranging from 2:1 to 1:2). A representative procedure is described below for making Polymer 2.

Preparation of Polymer 2 Solution (3 steps)

A] 3-Methylbenzyl bromide (24.64 g, $1.33\times10^{-1}$ mol, Aldrich) was dissolved in 221 g of diethyl ether in a 500 ml round bottomed flask. A 33% (w/w) solution of trimethylamine in methanol (35.80 g, $2.00\times10^{-1}$ mol, Acros) was added all at once, forming a white precipitate almost immediately. The reaction mixture was allowed to stir overnight at room temperature and was then filtered and washed three times with diethyl ether. The resulting white powder was dried in a vacuum oven overnight to afford 29.38 g (90% yield) of 3-methylbenzyl trimethylammonium bromide.

B] The bromide salt from step A (10 g) was dissolved in 100 ml of 9:1 methanol/water in a 250 ml round bottomed flask. Silver (I) oxide (9.5 g, $4.10\times10^{-1}$ mol, Aldrich) was added all at once and stirred for two hours at which point the silver oxide had changed color from a dark black to a dull gray. The solids were then filtered off, first using standard filter paper, then using a 0.5 μm Millipore FC membrane filter. The filtrates were concentrated to a volume of ~40 ml on a rotary evaporator. The concentration of hydroxide anion in the solution was determined to be 1.237. meq/g by HCl titration.

C] A 25% (w/w) aqueous solution (6.04 g) of polyacrylic acid (Polysciences, MW ~90,000) was combined with 1.79 methanol and 17.17 g of the solution from step B. A gummy precipitate initially formed and slowly redissolved over a 30 minutes. The polymer was stored as a 20% (w/w) solution in methanol-water.

Polymers 3–14 were synthesized using analogous procedures. Variations from the representative procedure are noted where applicable in TABLE II below.

Preparation of Polymer 15 Solution (3 steps)

A] Benzyl tris(hydroxyethyl)ammonium bromide was synthesized from triethanolamine and benzyl bromide using the procedure of Rengan et al (*J.Chem.Soc.Chem.Commun.,* 10, 1992, 757).

B] Benzyl tris(hydroxyethyl)ammonium bromide (26.78 g, $8.36\times10^{-2}$ mol) was dissolved in 250 ml of methanol and 5 ml water in a 500 ml round bottomed flask. Silver (I) oxide (20.56 g, $8.87\times10^{-2}$ mol) was added and the mixture was stirred at room temperature for 72 hours. The insoluble materials were filtered off and the filtrates were concentrated to 80 ml by rotary evaporation. The clear solution was passed through a flash chromatography column packed with 300 $cm^3$ DOWEX® 550A OH resin using methanol eluent and concentrated to ~50 ml by rotary evaporation. The concentration of hydroxide anion in the solution was determined to be 1.353. meq/g by HCl titration.

C] A 25% (w/w) aqueous solution (12 g) of polyacrylic acid (available from Polysciences, MW ~90,000) was combined with 13.30 g of methanol and 30.75 g of the solution from step A. The resulting polymer was stored as a 25% (w/w) solution in a water/methanol mixture.

Preparation of Polymer 16 solution (3 steps)

A] 2-methylbenzyl bromide (10.00 g, $5.40\times10^{-2}$ mol, Aldrich), triethanolamine (10.48 g, $7.02\times10^{-2}$ mol, Aldrich), and tetrahydrofuran (54 ml) were combined in a 200 ml round bottomed flask fitted with a reflux condenser and a nitrogen inlet. The reaction was stirred at reflux for 14 hours at which point a large amount of a white solid had formed. The solid was collected by vacuum filtration, recrystallized from ethanol, and dried overnight in a vacuum oven at 60° C. 10.67 g (59% yield) of a fine, white powder was collected.

B] 10.00 g ($2.99\times10^{-2}$ mol) of the product from step A was converted to the corresponding hydroxide salt using the procedure described for Polymer 2 (step B). 30 ml of a solution with a hydroxide content of 0.906 mEq/g was obtained.

C] 3.38 g of a 25% (w/w) aqueous solution of polyacrylic acid (available from Polysciences, MW ~90,000) was combined with 1.60 g of methanol and 15.02 g of the solution from step A. The resulting polymer was stored as a 20% (w/w) solution in a water/methanol mixture.

TABLE II

| Polymer # | Substituted Benzyl halide | Step A Conditions | Step A yield | [$^-OH$] (mEq/g) of ammonium hydroxide solution (Step 13) |
|---|---|---|---|---|
| 2 | 3-methylbenzyl bromide | Ether, 25° C., 20 hours | 90% | 1.237 |
| 3 | 3,5-dimethylbenzyl bromide | Ether, 25° C., 20 hours | 97% | 1.145 |
| 4 | 1-bromomethyl-3-methoxybenzene | Ether, 25° C., 20 hours | 98% | 1.204 |
| 5 | 3-chlorobenzyl bromide | Ether, 25° C., 20 hours | 98% | 1.256 |
| 6 | 4-bromobenzyl bromide | Ether, 25° C., 20 hours | 99% | 1.330 |
| 7 | 4-fluorobenzyl bromide | Ether, 25° C., 20 hours | 97% | 0.952 |
| 8 | 4-methoxybenzyl chloride | Ether, 25° C., 20 hours | 84% | 2.220 |
| 9 | 4-methylbenzyl bromide | Ether, 25° C., 20 hours | 98% | 1.372 |
| 10 | pentamethylbenzyl chloride | Ether, 3 eq. $NMe_3$, reflux, 20 hours | 98% | 1.100 |
| 11 | α-chloroisodurene | Ether, 3 eq. $NMe_3$, 20 hours at 25° C. then reflux for 4 hours | 83% | 1.520 |
| 12 | 3,4-dichlorobenzyl chloride | Ether, 3 eq. $NMe_3$, reflux for 24 hours | 54% | 1.09 |
| 13 | 2,4-dichlorobenzyl chloride | Ether, 3 eq. $NMe_3$, reflux, 20 hours | 61% | 1.14 |
| 14 | 3,4,5-trimethoxy-benzyl bromide* | Ether, 25° C., 20 hours | 88% | 0.516 |

*3,4,5-Trimethoxybenzyl bromide was synthesized from 3,4,5-trimethoxybenzyl alcohol using triphenylphosphine/$CBr_4$.

EXAMPLES

Formulation, Preparation and Use of Printing Plates

The formulation, coating, and imaging procedures described herein are analogous to those described in U.S. Ser. No. 09/454,151 (noted above). Coating formulations were prepared using each of the heat-sensitive switchable polymers and the additional components in such quantities as to provide 25 g coating mixtures of approximately 6% solids that, when coated at a wet coverage of 2.36 $cm^3/ft^2$ (25.5 $cm^3/m^2$) yield the target dry laydowns listed below in TABLE III. The diluent solvent was either 1:1 methanol-:water (Polymers 1–9) or methanol (Polymers 10–14). The components were combined in a glass jar and stirred vigorously with a magnetic stirrer for one hour to afford the coating mixtures. The coating mixtures were coated using a digitally controlled syringe drive coating machine on a mechanically grained and anodized aluminum support and dried in an oven at 80° C. for 20 minutes.

TABLE III

| Component | Laydown (mg/$m^2$) |
|---|---|
| Switchable polymer | 1080 |
| CR-5L epoxy resin (Esprit Chemicals) | 108 |
| FC-135 surfactant (3M) | 10.8 |
| FX-GE-003 carbon black dispersion (Nippon Shokubai) | 162 |

Infrared Exposure and Printing

The printing plates were exposed on an experimental platesetter (similar to the commercially available CREO TRENDSETTER™ platesetter, but smaller in size) having an array of laser diodes operating at a wavelength of 830 nm each focused to a spot diameter of 23 μm. Each channel provides a maximum of 450 mW of power incident on the recording surface. The plates were mounted on a drum whose rotation speed was varied to provide for a series of images set at various exposures as listed in TABLE IV below. The laser beams were modulated to produce halftone dot images.

TABLE IV

| Image | IMAGING POWER (mW) | IMAGING EXPOSURE (mJ/$cm^2$) |
|---|---|---|
| 1 | 356 | 360 |
| 2 | 356 | 450 |
| 3 | 356 | 600 |
| 4 | 356 | 900 |

The exposed printing plates were mounted on a commercial A. B. Dick 9870 duplicator press and prints were made using VanSon Diamond Black lithographic printing ink and Universal Pink fountain solution containing PAR alcohol substitute (Varn Products Company). Each plate was run for approximately 1,000 impressions.

For each plate, the roll-up (number of impressions printed before an image of acceptable density is obtained) and the imaging speed (lowest exposure for which a print of acceptable density was obtained) were noted. The results are tabulated in TABLE V below. Clearly, all of the Polymers 2–14 showed improvements in both criteria over the Control (Polymer 1) that comprised an unsubstituted benzyl group in the quaternary ammonium cation. Similarly, the 2-methyl substituted N,N,N-tris(hydroxyethyl) ammonium polymer (Polymer 16) showed notable improvements over Control Polymer 15 that had no substitution on the aromatic ring.

TABLE V

| Polymer | Roll-up (number of impressions) | Imaging speed (mJ/$cm^2$) |
|---|---|---|
| 1 (Control) | 200–250 | 900 |
| 2 m-methyl substituent | 50 | 450 |
| 3 2,5-dimethyl substituent | 50 | 450 |
| 4 m-methoxy substituent | 100 | 450 |
| 5 m-chloro substituent | 50 | 360 |
| 6 p-bromo substituent | 75 | 450 |
| 7 p-fluoro substituent | 100 | 450 |
| 8 p-methoxy substituent | 150 | 600 |
| 9 p-methyl substituent | 50 | 450 |

TABLE V-continued

| Polymer | Roll-up (number of impressions) | Imaging speed ($mJ/cm^2$) |
|---|---|---|
| 10 pentamethyl substituents | 50 | 450–650 |
| 11 2,4,6-trimethyl substituents | 25 | 450 |
| 12 3,4-dichloro substituents | 25–50 | 350 |
| 13 2,4-dichloro substituents | 50 | 450 |
| 14 3,4,5-trimethoxy substituents | 50–75 | 450–650 |
| 15 tris(hydroxyethyl) Control | 200–250 | 900 |
| 16 tris(hydroxyethyl) (2-methyl substituent) | 50 | 600 |

The invention has been described in detail with particular reference to preferred embodiments thereof, but it will be understood that variations and modifications can be effected within the spirit and scope of the invention.

I claim:

1. An imaging member comprising a support having thereon a hydrophilic imaging layer comprising a hydrophilic heat-sensitive polymer having a backbone and repeating units comprising quaternary ammonium carboxylate groups linked either directly or indirectly through the carboxylate groups, wherein the quaternary ammonium groups comprise at least one substituted-alkylene ($C_1$–$C_3$) phenyl group.

2. The imaging member of claim 1 further comprising a photothermal conversion material.

3. The imaging member of claim 2 wherein said photothermal conversion material comprises carbon black or is an infrared radiation absorbing dye.

4. The imaging member of claim 3 wherein said carbon black is a polymer-grafted or anionic surface-functionalized carbon black.

5. The imaging member of claim 1 wherein said heat-sensitive polymer is crosslinked.

6. The imaging member of claim 5 wherein said heat-sensitive polymer is crosslinked with an epoxy-containing resin in said imaging layer.

7. The imaging member of claim 1 further comprising a crosslinking agent in said imaging layer.

8. The imaging member of claim 1 wherein said heat-sensitive polymer comprises at least 1 mole of quaternary ammonium carboxylate groups per 1000 g of polymer.

9. The imaging member of claim 8 wherein said heat-sensitive polymer comprises from about 1 mole of quaternary ammonium carboxylate groups per 1000 g of polymer to about 1 mole of quaternary ammonium carboxylate groups per 45 g of polymer.

10. The imaging member of claim 1 wherein said heat-sensitive polymer is represented by Structure 1 below wherein "A" represents recurring units derived from ethylenically unsaturated polymerizable monomers, X is a spacer group, $R_1$, $R_2$ and $R_3$ are independently alkyl or aryl groups, or any two or all three of $R_1$, $R_2$ and $R_3$ can be combined to form one or two heterocyclic rings with the quaternary nitrogen atom, $R_4$ is a substituted alkylenephenyl group in which the alkylene portion has 1 to 3 carbon atoms, and B represents non-carboxylated recurring units, m is 0 to about 75 mol %, and n is from about 25 to 100 mol %

Structure 1

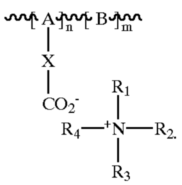

11. The imaging member of claim 10 wherein $R_4$ comprising a substituted or unsubstituted alkylene group having 1 to 2 carbon atoms and a phenyl group that can have up to five substituents.

12. The imaging member of claim 10 wherein $R_4$ comprises one or more halo, alkyl group, alkoxy group, cyano, nitro, aryl group, alkyleneoxycarbonyl group, alkylcarbonyloxy group, amido, amino carbonyl, formyl, mercapto or heterocyclic, trihalomethyl, perfluoroalkyl or alkyleneoxycarbonyl substituents.

13. The imaging member of claim 12 wherein $R_4$ comprises 1 to 5 halo, methyl, ethyl, methoxy or 2-ethoxy substituents on the phenyl moiety.

14. The imaging member of claim 10 wherein $R_1$, $R_2$ and $R_3$ are independently alkyl groups of 1 to 3 carbon atoms or hydroxyalkyl of 1 to 3 carbon atoms, and $R_4$ comprises 1 or 2 methyl, fluoro, chloro, bromo, methoxy or 2-ethoxy substituents.

15. A The imaging member of claim 10 wherein m is from 0 to about 50 mol %, and said B recurring units are derived from at least some additional ethylenically unsaturated polymerizable monomers having unreacted carboxy groups, acid anhydride units or a conjugate base thereof.

16. The imaging member of claim 15 wherein one of said additional monomers is acrylic acid, methacrylic acid, maleic anhydride or a conjugate base or a hydrolysis product thereof.

17. The imaging member of claim 1 wherein said support is an on-press printing cylinder.

18. A method of imaging comprising the steps of

A) providing the imaging member of claim 1, and

B) imagewise exposing said imaging member to energy to provide exposed and unexposed areas in the imaging layer of said imaging member, whereby said exposed areas are rendered more oleophilic than said unexposed areas by heat provided by said imagewise exposing.

19. The method of claim 18 wherein said imaging member further comprises a photothermal conversion material, and imagewise exposing is carried out using an IR radiation emitting laser.

20. The method of claim 18 wherein said imagewise exposing is carried out using a thermoresistive head.

21. The method of claim 18 wherein said imaging member is provided in step A by spraying said heat-sensitive polymer onto a cylindrical support.

22. A method of printing comprising the steps of:

A) providing the imaging member of claim 1,

B) imagewise exposing said imaging member to energy to provide exposed and unexposed areas in the imaging layer of said imaging member, whereby said exposed areas are rendered more oleophilic than said unexposed areas by heat provided by said imagewise exposing, and C) in the presence of water or a fountain solution, contacting said imagewise exposed imaging member with a lithographic printing ink, and imagewise transferring said ink to a receiving material.

23. The imaging member of claim 1 wherein said heat sensitive crosslinked polymer is any one of:
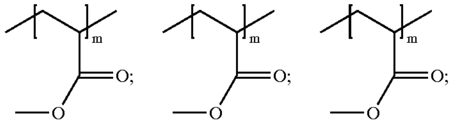
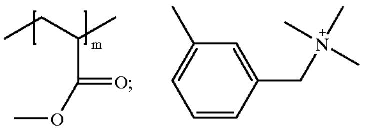
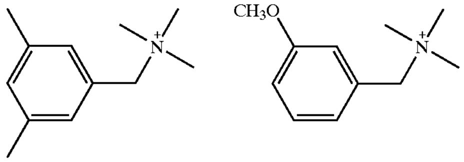
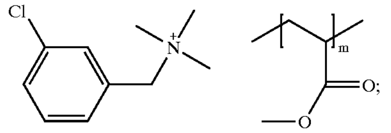
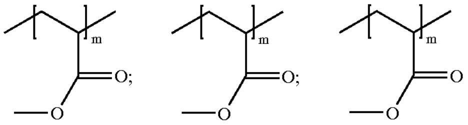
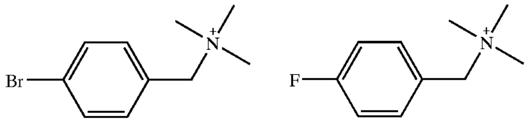
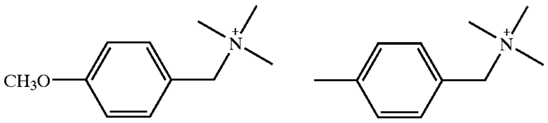
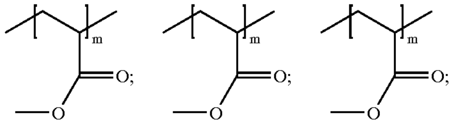
-continued
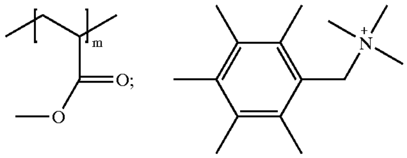
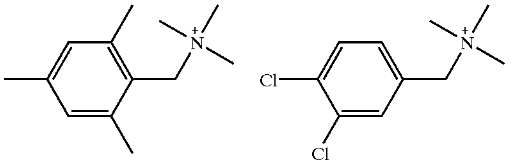
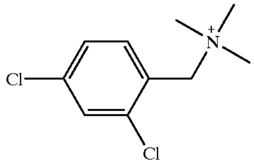
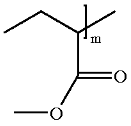
; or
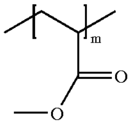
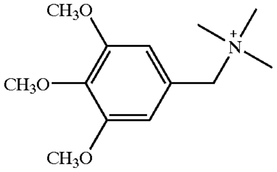
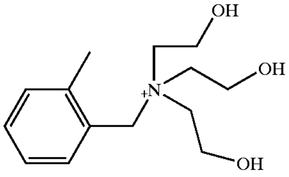
or a mixture of any two or more of these.
* * * * *

UNITED STATES PATENT AND TRADEMARK OFFICE

CERTIFICATE OF CORRECTION

PATENT NO. : 6,451,500 B1
DATED : September 17, 2002
INVENTOR(S) : Jeffrey W. Leon It is certified that error appears in the above-identified patent and that said Letters Patent is hereby corrected as shown below:

<u>Column 24,</u>
Line 12, change “comprising” to -- comprises --
Line 29, delete the word “A”
Line 39, add a colon after “of”

Signed and Sealed this

Sixth Day of May, 2003

JAMES E. ROGAN
*Director of the United States Patent and Trademark Office*